United States Patent

Fuderer et al.

[11] Patent Number: 6,049,623
[45] Date of Patent: Apr. 11, 2000

[54] DIRECTIONAL ADAPTIVE NOISE REDUCTION

[75] Inventors: Miha Fuderer, Eindhoven, Netherlands; Til Aach; Dietmar W. Kunz, both of Aachen, Germany

[73] Assignee: U.S. Philips Corporation, New York, N.Y.

[21] Appl. No.: 08/770,389

[22] Filed: Dec. 20, 1996

[30] Foreign Application Priority Data

Dec. 21, 1995 [EP] European Pat. Off. ............. 95203590
Oct. 16, 1996 [EP] European Pat. Off. ............. 96202880

[51] Int. Cl.[7] ................................................ G06K 9/00
[52] U.S. Cl. .................... 382/131; 382/132; 382/134; 382/253
[58] Field of Search ..................... 382/276, 130, 382/131, 132, 134, 266, 277, 272, 210, 250, 253, 282

[56] References Cited

U.S. PATENT DOCUMENTS

| | | | |
|---|---|---|---|
| 5,040,225 | 8/1991 | Gouge | 382/128 |
| 5,063,524 | 11/1991 | Ferre et al. | 364/516 |
| 5,168,375 | 12/1992 | Reisch et al. | 358/432 |
| 5,224,175 | 6/1993 | Gouge et al. | 382/128 |
| 5,253,307 | 10/1993 | Wayner et al. | 382/22 |
| 5,267,328 | 11/1993 | Gouge | 382/128 |
| 5,281,914 | 1/1994 | Conturo et al. | 324/309 |
| 5,424,556 | 6/1995 | Symosek et al. | 250/561 |
| 5,483,968 | 1/1996 | Adam et al. | 128/696 |
| 5,499,057 | 3/1996 | Kondo et al. | 348/607 |
| 5,586,202 | 12/1996 | Ohki et al. | 382/236 |
| 5,587,927 | 12/1996 | Nagao et al. | 364/514 |
| 5,633,951 | 5/1997 | Moshfeghi | 382/154 |
| 5,740,268 | 4/1998 | Nishikawa et al. | 382/132 |
| 5,800,354 | 9/1998 | Hofland et al. | 600/410 |
| 5,825,846 | 10/1998 | Aach et al. | 378/98 |
| 5,854,851 | 12/1998 | Bamberger et al. | 382/132 |
| 5,875,040 | 2/1999 | Matraszek et al. | 358/453 |

FOREIGN PATENT DOCUMENTS

| | | |
|---|---|---|
| 0596409A2 | 5/1994 | European Pat. Off. . |
| 0627696A2 | 12/1994 | European Pat. Off. . |
| 4405232C1 | 5/1995 | Germany . |
| 9618976 | 6/1996 | WIPO . |

*Primary Examiner*—Leo H. Boudreau
*Assistant Examiner*—Kanji Patel
*Attorney, Agent, or Firm*—Dwight Renfrew

[57] ABSTRACT

An image is processed taking into account the direction of a predominant structure of the image. Said predominant direction is derived from image information in the image. In particular, the covariance matrix having matrix elements depending on products of differences between pixel-values in separate directions is calculated. The eigenvectors of the covariance matrix correspond with the predominant direction of the image structure and the eigenvalues of the covariance matrix represent the strength of the structure in the image. The covariance matrix is computed locally, i.e. for separate regions in the images so as to take variations of the direction of predominant structures into account.

12 Claims, 1 Drawing Sheet

DIRECTIONAL ADAPTIVE NOISE REDUCTION

BACKGROUND OF THE INVENTION

1. Field of the Invention

The invention relates to a method for processing an image wherein image information is processed depending on a dominant direction of image structure in the image.

2. Description of the Related Art

Such a method for processing an image is known from the German Offenlegunsgschrift DE 44 31 349.
Such a method is in particular suitable to be applied to a medical diagnostic image which is e.g. obtained by magnetic resonance imaging (MRI), x-ray imaging or x-ray computed tomography (CT). Such an image contains a noise component which obscures small details with only little contrast. However, such small details in the image can be of particular medical relevance, viz. small deviations such as tumours in an early stage of the pathology should be made visible in a rendition of a medical diagnostic image. In x-ray imaging, the quantum shot noise of the x-rays is an important cause for noise in the image. In MRI imaging a dominant source of noise is formed by electronic noise in the system which receives radio-frequent magnetic resonance signals which represent relaxation of excited nuclear spins in the body of the patient.

I. The method disclosed in the cited reference aims at improving the quality of MRI images. According to the known method for processing an image, four sub-images are formed by low-pass directional filtering the input image. Each of the sub-images is obtained from the input image by smoothing the pixel-values along four respective predetermined directions in the image are formed. Subsequently, difference images which represent the difference between the input-image and the respective sub-images. Pixel-values of respective positions in the processed image are obtained in the form of weighted averages of pixel-values of the corresponding positions of the respective sub-images are formed. The weights are derived as decreasing functions of pixel-values of said difference images. Structures in the image that run along the predetermined directions are substantially retained, while a noise component of the processed image is reduced as compared to the input image.

A drawback of the known method for processing an image is that the preservation of image structures relies on the limited number of predetermined directions in that image structures which run along a direction between two of the predetermined direction are less well preserved than image structures along a predetermined direction. Thus, when the known method of processing an image is applied to a medical diagnostic image, small but elongated details may become badly visible in a rendition of the processed image. Moreover, especially in three or more dimensional images the known method requires many predetermined directions and thus a huge computational effort to achieve an adequate improvement of the image quality.

SUMMARY OF THE INVENTION

An object of the invention is to provide a method for processing an image in which a noise component is reduced and image structure is better preserved compared to the result obtained by the known method. An object of the invention is also to provide a method for processing an image which achieves a better result to make diagnostic details recognizable as compared to the known method.

These objects are achieved by the method for processing an image according to the invention characterised in that said dominant direction is derived from image information in the image.

An image includes an n-dimensional dataset of pixel-values which represent grey-values or colour-values. A particular example is an image which is represented as a two-dimensional set of pixel-values and a time-sequence of two-dimensional or three-dimensional image can be represented as a three-dimensional or four-dimensional dataset. Further, data relating to a substantially three-dimensional volume of an object form a three-dimensional dataset. Such a three-dimensional dataset in particular is obtained when a volume reconstruction of density distributions obtained with computed tomography or magnetic resonance imaging is performed. The dataset of such images include pixel-values which represent grey-values of colour values which represent brightness values of the image. The pixel-values carry image information, notably in that variations of pixel-values over the positions in the image determine the picture that is in fact rendered visible when the image is displayed.

Image processing aims at improving the quality of the image and includes in particular noise reduction, reduction of perturbations, contrast enhancement and edge enhancement. Image processing of a medical diagnostic image aims especially at improving rendition of small details in the image. The image processing method according to the invention preserves details of the image while reducing perturbations such as noise in the image. Often image information comprises image structure extending along a dominant direction whereas perturbations such as noise are more or less uniformly distributed over a wide range of directions in the image. An important cause of noise in x-ray images is quantum shot noise which is attributed to the corpuscular nature of x-ray photons and which is hardly directionally correlated. Details in the image are preserved by processing the image while taking said dominant direction of image structure into account.

Because said dominant direction of image structure is derived from the image independently of information outside of the image, the image processing preserves image structure independently of the direction of such structures. Thus image structure is well preserved no matter its direction in the image.

According to the method of the invention said dominant direction can be derived locally in the image, so that the image processing can take separate dominant directions in different parts of the image into account. In particular, the method of the invention is suitable to preserve several image structures having different dominant directions and the also to preserve an image structure having a curved form.

When the image processing method according to the invention is applied to a medical diagnostic image, like an x-ray computed tomography image or a magnetic resonance image, it is achieved that small elongated details with little contrast are preserved and noise and perturbations in the image are reduced. In this way it is achieved that relevant details in the image are rendered well visible so that the diagnostic quality of the image is improved.

Moreover, as the method according to the invention does not require that sufficiently many predetermined directions are set along which image structures can be detected, the method according to the invention is suitable to be employed to three or more dimensional images.

According to a preferred implementation of the method of the invention, a dominant direction of image structure in the image is derived from differences between pixel-values of respective positions in the image, differences between pixel-values of respective positions in the image are processed in dependence of said dominant direction and a difference between said respective position, from said processed differences processed pixel-values for a processed image are derived. Processing steps to improve the quality of the image in that perturbations and/or noise are reduced are advantageously performed on differences of pixel-values. Differences between pixel-values which represent an image structure often are directionally correlated whereas differences between pixel-values which are attributed to a perturbation and/or noise are more or less uniformly distributed over a wide range of directions. The processing takes a dominant direction into account so as to achieve that noise and/or perturbations are reduced but image structure is preserved. Because such a dominant direction is derived from differences between pixel-values of respective positions in the image, any image structure is preserved independently of its dominant direction.

In a preferred implementation of the method according to the invention local gradients of pixel-values of the image are computed, a local covariance matrix of said local gradients is formed and at least one eigenvector of the local covariance matrix is computed.

The covariance matrix has matrix elements that depend on differences between pixel-values of positions that are spaced apart in separate directions. In particular, the matrix elements of the covariance matrix depend on respective products of differences between pixel-values of positions that are spaced apart in separate directions. Notably, the matrix elements of the covariance matrix depend on products of components of a local gradient field of pixel-values. Said eigenvector represents the dominant direction of an image structure which is present in the part of the image from which the local gradients are taken. The formation of local covariance matrices of local gradients is a relatively simple mathematical operation. The computation of one or more eigenvectors can be carried out by means of generally known mathematical methods and is easily implemented in a processing unit. For diagonalisation of a three-dimensional or a four-dimensional covariance matrix the Jacobi method as known form the handbook Numerical Recipes by Press, Flannery and Teukossky (Cambridge University Press 1986, Chapter 11.1) is appropriate.

Moreover, the computation of one or more eigenvectors of the local covariance matrix takes only a very small amount of computational effort, in particular the required computation time is very short. Hence, the method according to the invention does not require expensive computational power and is able to compute eigenvectors representing dominant directions in many portions of the image. In practice it turns out that within a fraction of a second of processing time many portions of the image, even all pixel-positions of the image can be handled. Therefore, the method according to the invention is able to preserve image structure in an image which contains many image structures having different directions or image structures which have a complicated shape.

In a preferred implementation of the method according to the invention said processed pixel-values are derived from pixel-values of the image and one or several eigenvalues of the local covariance matrix.

An eigenvalue relating to an eigenvector of the local covariance matrix represents an amount of structure along the direction in the image which corresponds to said eigenvector. When in a two-dimensional image one eigenvalue is much larger than the other eigenvalue, then there is a clear image structure along the direction relating to the eigenvector associated with the large eigenvalue. As an eigenvalue is larger, the corresponding image structure is more strongly correlated along the direction of the associated eigenvector. When eigenvalue do not differ much, there is hardly any directional structure in the image. In a three-dimensional image a line-shaped structure such as a representation of a bloodvessel gives rise to two eigenvalues which are much larger than a third eigenvalues; one eigenvalue which is much larger than the other two indicates a surface-like structure such as the surface of an organ or an object.

Because the image processing involves the eigenvalues of the covariance matrix the amount of directionality of image structures is taken into account. The more directional correlation, as indicated by on or more relatively large eigenvalues, the less probable such a structure is caused by noise or perturbations. Thus, the method according to the invention distinguishes weak image structures that have most probably arisen by chance due to noise or perturbations from image structures having a strong directional correlations which relate to relevant details in the image. Because a local covariance matrix and its eigenvalues are computed for separate parts, even separate pixels of the image, the method according to the invention takes spatial differences of the strength of the image structure into account. Thus, a further refinement in the distinction between noise and perturbations from relevant image details is achieved.

In a preferred implementation of the method according to the invention said processed pixel values are derived from weighted averages of differences between pixel-values of the image, the weighted average involving weights depending on one or several eigenvalues of the local covariance matrix.

The weights are associated with the probability that a local dominant direction has arisen by chance from either noise or randomly distributed perturbations or from a local dominant direction which is associated with an image structure of a relevant detail in the image. Thus it is achieved by simple and rapid computational steps to more or less discard weak directional structures whereas strong directional structures are preserved while the image quality is improved e.g. in that noise is reduced and/or perturbations are removed. Preferably the weights are chosen taking the distribution of magnitudes eigenvalues into account. Weights associated with a dominant direction are chosen such that they are larger as the corresponding eigenvalue is larger relative to eigenvalues relating to one ore several other directions. The dependence of the weights $w_r$ is such that $w_r$ is about or larger than unity if $\lambda_r$ is larger than the subsequent eigenvalues and w has a small, much less than unity, magnitude if $\lambda_r$ is exceeded by preceding eigenvalues. The eigenvalues being sorted in decreasing order.

A preferred implementation of the method according to the invention includes that the image is divided in one or more blocks and for the or separate blocks spectral coefficients are derived from said blocks, a noise level of the image is estimated, reduced spectral coefficients are derived from spectral coefficients and the noise level, processed blocks are synthesised from said reduced spectral coefficients, and processed blocks are assembled into a processed image and is characterised in that for deriving the reduced spectral coefficients, a spatial distribution in the image of image information to which the spectral coefficients relate is taken into account.

When the image is divided into several blocks which are separately processed, then differences in noise levels of separate blocks are taken into account. In particular even if in separate portions of the image the noise levels are different, the image processing method of the invention yields a processed image in which noise is effectively reduced while relevant image information is maintained.

To derive spectral coefficients from pixel-values a frequency transform such as a fast Fourier transform (FFT), a discrete cosine transform (DCT), a discrete sine transform (DST) or a discrete Hartley transform, is applied to pixel-values of separate blocks. The spectral coefficients represent frequency components of pixel-values of the image. Preferably before the frequency transform is applied the pixel-values of separate blocks are multiplied by a suitable window-function in order to avoid artefacts in the processed image. Subsequently, the frequency transform is applied to the products of the pixel-values and the window function. Further details of such windows are known from the numerical mathematics handbook *Numerical Recipes* by William H. Press et al. (Chapter 12.7). To reduce noise in the image reduced spectral coefficients are derived from the spectral coefficients and the estimated noise level. From the reduced spectral coefficients pixel-values for respective processed blocks are synthesised. The pixel-values for a processed block represent image information from which noise is substantially removed. The noise reduction by deriving reduced spectral coefficients from spectral coefficients and the estimated noise level is particularly suitable for reducing Poisson noise in an x-ray image. Such a method for noise reduction is described in the European patent application No. 95 203 590.5. Furthermore, in separate blocks portions of image structure take up a relatively large portion of respective blocks although the image structure may take up a rather small portion of the entire image. As a consequence, in the spectral coefficients of separate blocks there is less mixing of image information with noise as a smaller block-size is employed. On the other hand blocks should be sufficiently large to be able to contain substantial image structures. In practice suitable blocksizes are 32×32 or 64×64 pixels. As the blocks are processed independently of one another the blocks can be processed either in parallel or in series. In case a rapid succession of images is processed, the estimated noise level is preferably split into several contributions.

This implementation allows to retain image information relating to a very elongate structure in the processed image even if having little contrast, while noise is reduced. This is achieved in that noise is distinguished from image information included in spectral coefficients that have large values in one or a few directions in the image, while noise gives rise to spectral coefficients that are substantially spatially uniformly distributed. In particular, spectral coefficients that correspond to a low signal-to-noise value but that are also corresponding to an elongate structure having a dominating direction are prevented from being attenuated. To this end for separate spatial frequencies local signal-to-noise ratios are computed as the squared ratio of the spectral coefficient to the noise level pertaining to the average brightness of the block at issue. Preferably, the noise level is multiplied by a factor that takes the transfer characteristic of the imaging system into account. In order to counteract high sensitivity to artefacts in the image, the local signal-to-noise are clipped so that their values fall within a predetermined range. From the two-dimensional collection of (clipped) local signal-to-noise ratios one or several main directions are determined along which the local signal-to-noise values having relatively high values are concentrated. These main directions in the spatial frequency domain are associated with to directions in the image along which image structures extend. In particular, when a striking image structure extends horizontally in the image then there are strong variations of pixel values along vertical ines in the image. That is pixel-values $p_{nm}$ vary predominantly with the first index n, whereas it varies only very slowly with the second index m. Upon spatial frequency transforming such an image the spectral coefficients and thus the local signal-to-noise values $c_{ij}$ have relatively high values for the second index j having low values. In particular, local signal-to-noise values $c_{ij}$ have high values for j=0.

Said main directions are for example derived from a so-called 'inertia matrix' which has as its matrix elements weighted averages of local signal-to-noise values. The weights pertain to distances along the respective axes in the frequency domain of the local signal-to-noise ratio concerned. Such main directions correspond to the principal axes of the inertia matrix. Once the main directions are derived along which local signal-to-noise values with relatively high values are concentrated the distance in the frequency domain of local signal-to-noise ratios to the one or several main directions may be computed. Alternatively, one may calculate for separate local signal-to-noise ratios, the angle included between the line through the origin in the frequency domain and the position of the local signal-to-noise ratio and the line through the origin along the or one of said main directions. In order to avoid that local-signal-to noise at or close to the main directions are reduced too much, the reduced spectral coefficients are derived from the local signal-to-noise ratios taking into account the distance in the frequency domain between the local signal-to-noise ratio concerned and said one or several main directions as an alternative said angle may be taken into account. Preferably, a spectral coefficient corresponding to a local signal-to-noise is decreased more as it is located further away from the main directions in order to derive a reduced spectral coefficient that retains image information although the corresponding local signal-to-noise ratio may be rather small.

The method according to the invention is preferably carried-out by means of a suitably programmed general purpose computer. Alternatively, a special purpose (micro) processor comprising electronic circuits specially designed to perform the method according to the invention can be advantageously employed. In particular, the method according to the invention is carried-out on an image signal having signal levels which represent pixel-values of the image.

BRIEF DESCRIPTION OF THE DRAWING

These and other aspects of the invention will be elucidated with reference to the embodiments described hereinafter and with reference to the accompanying drawing wherein.

DESCRIPTION OF THE PREFERRED EMBODIMENT

Figure 1:
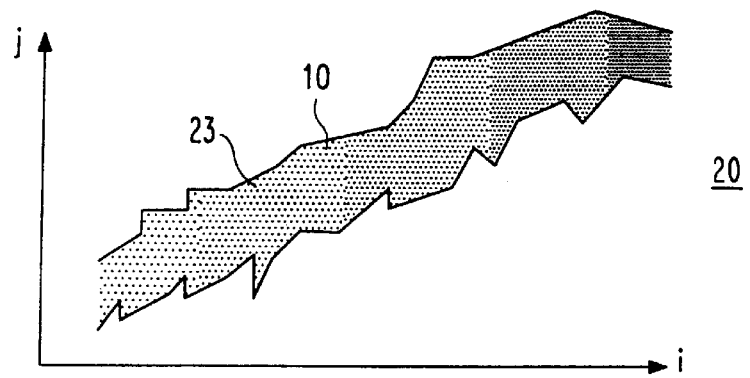
FIG. 1 shows a two-dimensional image showing an elongate structure, having ragged edges.

FIG. 1 shows a two-dimensional image showing an elongate structure having ragged edges. For example the image shown in FIG. 1 is a magnetic resonance image which represents a bloodvessel of a patient. In this example an elongate structure 10 represents bloodvessel of a patient.

The intensity of the structure increases from left to right in the image. The grey-values of the image are represented by a two-dimensional matrix of pixel-values $p_{ij}$. An image signal representing the image has signal levels $p_{ij}$, for example, pixel 23. The indices ij denote in Cartesian co-ordiates the position of the pixel in the image.

Figure 2:
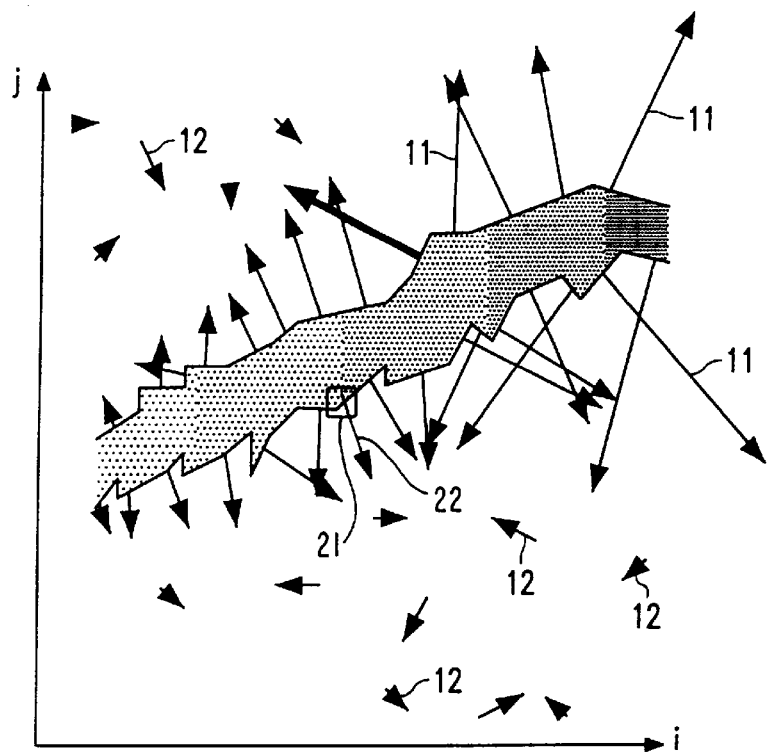
FIG. 2 shows a vector field which represents orientations of dominant differences between pixel-values and FIG. 3 shows a two-dimensional image that results from performing the method of image processing according to the invention to the image shown in FIG. 1.

FIG. 2 shows a vector field which represents orientations of dominant differences between pixel-values. In fact the vector field shown in FIG. 2 is a rendition of the gradient field of the pixel-values; the gradient field is a two-dimensional vector with components $$\nabla p_{ij} = \begin{bmatrix} p_{i+1,j} - p_{ij} \\ p_{i,j+1} - p_{ij} \end{bmatrix}$$

The gradient field is represented in FIG. 2 by arrows at separate positions. The direction of each arrow represents the direction of the gradient field, the length of the arrow represents the magnitude of the gradient field at the position at issue. Because of the elongate structure which represents the bloodvessel most arrows have a predominant direction, either upward and somewhat to the left or downward and somewhat to the right. Thus, the components of the gradient field are correlated. In addition to the relatively long arrows, a few of which are indicated with the reference numeral 11, having the predominant direction there are some short arrows, a few of which are indicated with the reference number 12, pointing in random directions due to noise in the image.

The covariance matrix is calculated for respective relatively small respective regions of the image. In particular the covariance matrix is calculated for each pixel-position in the image, over respective regions in the image which include the pixel-position at issue. It appears that regions of about 7×7 or 9×9 pixels are suitable. Such regions are sufficiently small so that the covariance matrix comprises local correlations of predominant directions in the image and on the other hand such regions are large enough to allow noise to average out. The covariance matrix is given as $$C = \sum_{region} \nabla p \otimes \nabla p$$

that is, the covariance matrix has as its matrix elements $$C_{rs} = \sum_{region} (\nabla p)_r (\nabla p)_s.$$

Subsequently, the covariance matrix is diagonalized. The eigenvalues of the covariance matrix are denoted as $\lambda_r$ and the transformation matrix which transforms the Cartesian co-ordinate system into a orthogonal co-ordinate system based on the principal axes of the covariance matrix is denoted T. In fact, then the matrix T represents a local rotation from the Cartesian co-ordinate system of the image to an orthogonal co-ordinate system defined by the principal axes of the covariance matrix. Thus the covariance matrix C is connected to the diagonal matrix $\Lambda$ by $C=T^t\Lambda T$. In the two-dimensional case discussed here there are only two eigenvalues. The higher dimensional the image is, the more eigenvalues there are. In particular in three dimensions such as in the event of the three-dimensional volume reconstruction, there are three eigenvalues. The eigenvectors, i.e. the principal axes of the covariance matrix correspond to dominant directions, for example, dominant direction 22 in small region 21 of image structure in the image and the magnitude of the eigenvalues is a measure for the strength of the image structure in the associated direction.

For diagonalization of a two-dimensional or a three-dimensional covariance matrix the Jacobi method as known form the handbook Numerical Recipes by Press, Flannery and Teukossky (Cambridge University Press 1986, Chapter 11.1) is appropriate.

To proceed further in the image processing, from the eigenvalues and the gradient field a weighted gradient field is formed where weights are employed which depend on the eigenvalues. Preferably, the weights have a value close to or above unity in the event, i.e. in a region, where one eigenvalue is much larger than the other one and the weight has a small magnitude in regions where the difference between the eigenvalues has a relatively small magnitude. That is, the weighted gradient field denoted $\nabla p_{ij}$, is formed according to $\nabla^w p_{ij} = w(\lambda_r, \lambda_s) \cdot \nabla p_{ij}$. The weightfactor w depends on the eigenvalues of the covariance matrix for the region which includes the pixel $p_{ij}$. The weightfactor w is in fact a two dimensional vector with components $w_r$.

Subsequently from the weighted gradient field pixel-values of the processed image are derived. To that end the weighted gradient field is rotated back to the Cartesian co-ordinate system of the image. This is carried out in practice by applying the matrix $T^t$ to the weighted gradient field $\nabla^w p_{ij}$. From the back-rotated gradient field $T^t \nabla^w p_{ij}$, the pixel-values $\overline{p_{ij}}$ of the processed image can be computed by integration and suitably combining the integrated values. A more robust computation of the pixel-values $\overline{p_{ij}}$ of the processed image from the back-rotated gradient field is carried-out in that the divergence field of the back-rotated gradient field is formed: $\text{div} T^t \nabla^w p_{ij} = \nabla \cdot T^t \nabla^w p_{ij}$, this quantity is interpreted as a convolution of the processed pixels $\overline{p_{ij}}$ with a Laplacian kernel. Thus, the processed pixel-values are simply obtained by deconvolution which is conveniently performed as a division of the Fourier transform.

Figure 3:
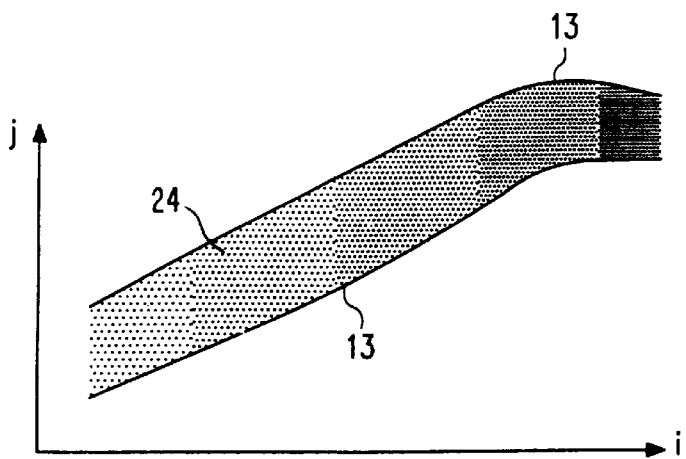

FIG. 3 shows a two-dimensional image that results from performing the method of image processing according to the invention to the image shown in FIG. 1. In particular FIG. 3 shows the processed image which is formed with the pixel-values $\overline{p_{ij}}$, for example, processed pixel 24. Much smoother edges 13 are obtained while the contrast at an edge is retained or even increased. Furthermore the variation of the intensity in the structure is retained.

All references cited herein are incorporated herein by reference in their entirety and for all purposes to the same extent as if each individual publication or patent or patent application was specifically and individually indicated to be incorporated by reference in its entirety for all purposes.

We claim:

1. A method of processing a medical image, the medical image comprising a plurality of pixel values, the method comprising:
    (a) deriving a plurality of dominant directions of image structure from the medical image, wherein each dominant direction is derived from differences between pixel-values in one of a plurality of small regions throughout the medical image and independently of information outside the image; and
    (b) providing processed pixel values throughout the medical image, wherein the processed pixel values are determined from the derived plurality of dominant directions by taking into account amounts of directionality of the dominant directions so that weak direction structures in the image are substantially discarded and strong directional structures in the image are substantially preserved, whereby a processed medical image is provided.

2. A method of processing a medical image, the medical image comprising a plurality of pixel values, the method comprising:
   (a) deriving a plurality of dominant directions of image structure from the medical image, wherein each local dominant direction is derived from differences between pixel-values in one of a plurality of small regions throughout the medical image and independently of information outside the image;
   (b) providing processed differences between pixel-values throughout the medical image, wherein the processed differences between pixel-values are determined from the plurality of dominant directions and differences between pixel values; and
   (c) deriving processed pixel values from said processed differences between pixel-values in the medical image,
   whereby a processed medical image is provided.

3. A method of processing an image as claimed in claim 2 wherein the step of deriving the plurality of dominant directions of image structure further comprises computing gradients of pixel-values of the image, a plurality of covariance matrices from sums throughout each of the plurality of small regions of products of said gradients, and one or several local eigenvectors and associated eigenvalues of the plurality of covariance matrices.

4. A method for processing an image as claimed in claim 3, wherein said processed differences between pixel-values are derived from pixel-values of the image and from the one or several eigenvalues of the plurality of covariance matrices.

5. A method for processing an image as claimed in claim 4, wherein said processed differences between pixel values are weighted averages of differences between pixel-values of the image, the weighted average involving weights depending on the one or several eigenvalues of the plurality of local covariance matrices.

6. A method for processing an image as claimed in claim 2, wherein the step of deriving processed pixel-values further comprises integrating the processed differences between pixel-values and suitably combining the integrated values.

7. A method for processing an image as claimed in claim 2, wherein the step of deriving processed pixel-values further comprises computing deconvolutions of divergences of the processed differences between pixel-values.

8. The method of claim 2 wherein the small regions are between 7×7 and 9×9 pixels in size.

9. A method of processing a medical image, the medical image comprising a plurality of pixel values, the method comprising:
   (a) deriving a plurality of dominant directions of image structure from the medical image, wherein each dominant direction is derived locally from differences between pixel-values in one of a plurality of small regions throughout the medical image by computing (i) gradients of pixel-values of the image, (ii) a plurality of covariance matrices from sums throughout each of the plurality of small regions of products of said local gradients, and (iii) one or several eigenvectors and associated eigenvalues of the plurality of covariance matrices,
   (b) providing processed differences between pixel-values in the medical image, wherein the processed differences between pixel-values depend on the plurality of dominant directions and differences between pixel values, and
   (c) deriving processed pixel values from said processed differences between pixel-values throughout the medical image,
   whereby a processed medical image is provided.

10. The method of claim 9 wherein said processed differences between pixel-values are derived from pixel-values of the image and the one or several eigenvalues of the plurality of covariance matrices.

11. The method of claim 10 wherein said processed differences between pixel values are weighted averages of differences between pixel-values of the image, the weighted averages involving weights depending on the one or several eigenvalues of the Plurality of covariance matrices.

12. A method of processing a medical image, the medical image comprising a plurality of pixel values, the method comprising:
   (a) deriving a plurality of dominant directions of image structure from the medical image, wherein each dominant direction is derived from differences between pixel-values in one of a plurality of small regions throughout the medical image;
   (b) providing processed differences between pixel-values in the medical image, wherein the processed differences between pixel-values depend on the plurality of dominant directions and differences between pixel values; and
   (c) deriving processed pixel values from said processed differences between pixel-values throughout the medical image by computing deconvolutions of divergences of the processed differences between pixel-values,
   whereby a processed medical image is provided.

* * * * *